US012564051B2

(12) United States Patent
Siko et al.

(10) Patent No.: US 12,564,051 B2
(45) Date of Patent: Feb. 24, 2026

(54) HEAT SPREADER APPARATUS WITH MAGNETIC ATTACHMENTS ON PRINTED WIRING BOARD ASSEMBLIES, RELATED METHODS AND ELECTRONIC SYSTEMS

(71) Applicant: Micron Technology, Inc., Boise, ID (US)

(72) Inventors: Charles E. Siko, Boise, ID (US); Kaleb A. Wilson, Caldwell, ID (US); Bradley R. Bitz, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 606 days.

(21) Appl. No.: 17/821,871

(22) Filed: Aug. 24, 2022

(65) Prior Publication Data

US 2024/0071863 A1 Feb. 29, 2024

(51) Int. Cl.
*H01L 23/40* (2006.01)
*H01L 23/00* (2006.01)
(Continued)

(52) U.S. Cl.
CPC .......... *H01L 23/40* (2013.01); *H01L 23/4006* (2013.01); *H01L 23/49811* (2013.01);
(Continued)

(58) Field of Classification Search
CPC ....... H05K 1/0201; H05K 1/0203–021; H05K 1/181; H05K 1/182–188; H05K 3/0011–0055; H05K 3/22; H05K 2201/09063; H05K 2201/09127; H05K 2201/09072; H05K 2201/08–086; H05K 2201/10598; H05K 2201/06–068; H05K 2201/09136; H05K 2202/09036; H05K 2203/10–108; H05K 1/0271;
(Continued)

(56) References Cited

U.S. PATENT DOCUMENTS

| 2012/0014068 A1* | 1/2012 | Nakanishi | H01L 23/40 |
| | | | 361/717 |
| 2019/0074614 A1* | 3/2019 | Chen | H01R 12/73 |

(Continued)

OTHER PUBLICATIONS

Chapter 6.9: Hard and Soft Magnets. Introduction to Inorganic Chemistry Wikibook. https://chem.libretexts.org/Bookshelves/Inorganic_Chemistry/Introduction_to_Inorganic_Chemistry_(Wikibook). (Year: 2020).*

(Continued)

*Primary Examiner* — Dale E Page
*Assistant Examiner* — Douglas Yap
(74) *Attorney, Agent, or Firm* — TraskBritt

(57) ABSTRACT

A printed wiring board assembly is disclosed that includes a printed wiring board with a first side and a second side opposite first side. Magnet structures are in physical contact with the printed wiring board and a microelectronic device component is coupled to the first side of the printed wiring board. A heat spreader overlies and is in thermal communication with the microelectronic device component, and posts are coupled to the heat spreader and horizontally neighbor the microelectronic device component, where the posts are in magnetic communication with the magnet structures. Related methods and electronic systems are also disclosed.

21 Claims, 4 Drawing Sheets

(51) Int. Cl.

| | |
|---|---|
| *H01L 23/498* | (2006.01) |
| *H01L 25/00* | (2006.01) |
| *H01L 25/065* | (2023.01) |
| *H05K 1/02* | (2006.01) |
| *H05K 1/18* | (2006.01) |
| *H05K 1/183* | (2026.01) |

(52) U.S. Cl.
CPC .......... *H01L 24/92* (2013.01); *H01L 25/0655* (2013.01); *H05K 1/183* (2013.01); *H01L 2023/4062* (2013.01); *H01L 2023/4087* (2013.01); *H01L 24/16* (2013.01); *H01L 24/32* (2013.01); *H01L 24/48* (2013.01); *H01L 24/73* (2013.01); *H01L 25/50* (2013.01); *H01L 2224/16227* (2013.01); *H01L 2224/32245* (2013.01); *H01L 2224/48225* (2013.01); *H01L 2224/73253* (2013.01); *H05K 1/0271* (2013.01); *H05K 2201/06* (2013.01); *H05K 2201/09136* (2013.01)

(58) Field of Classification Search
CPC ......... H05K 1/06–068; H05K 1/09136; H05K 2201/062; H05K 2201/066; H05K 2201/068; H05K 2201/083; H05K 2201/086; H05K 2203/104; H05K 7/20409; H05K 7/20418; H01L 2023/4062; H01L 2023/4037–4087; H01L 23/36–3738; H01L 23/15; H01L 23/34; H01L 23/40–4093; H01L 23/42–4338; H01L 23/4006; H01L 23/4338; H01L 23/4087; H01L 23/367; H01L 2023/405; H01L 21/4882; H01L 21/4871
See application file for complete search history.

(56) References Cited

U.S. PATENT DOCUMENTS

| | | | |
|---|---|---|---|
| 2019/0079567 A1* | 3/2019 | Antoniswamy | H01L 23/40 |
| 2023/0137164 A1* | 5/2023 | Yeh | H01L 23/10 257/730 |
| 2023/0197543 A1* | 6/2023 | He | H01L 23/49894 257/787 |
| 2023/0268290 A1* | 8/2023 | Rasalingam | H01L 23/3677 257/668 |

OTHER PUBLICATIONS

Merriam-Webster dictionary entry for post. (Year: 1828).*

\* cited by examiner

800

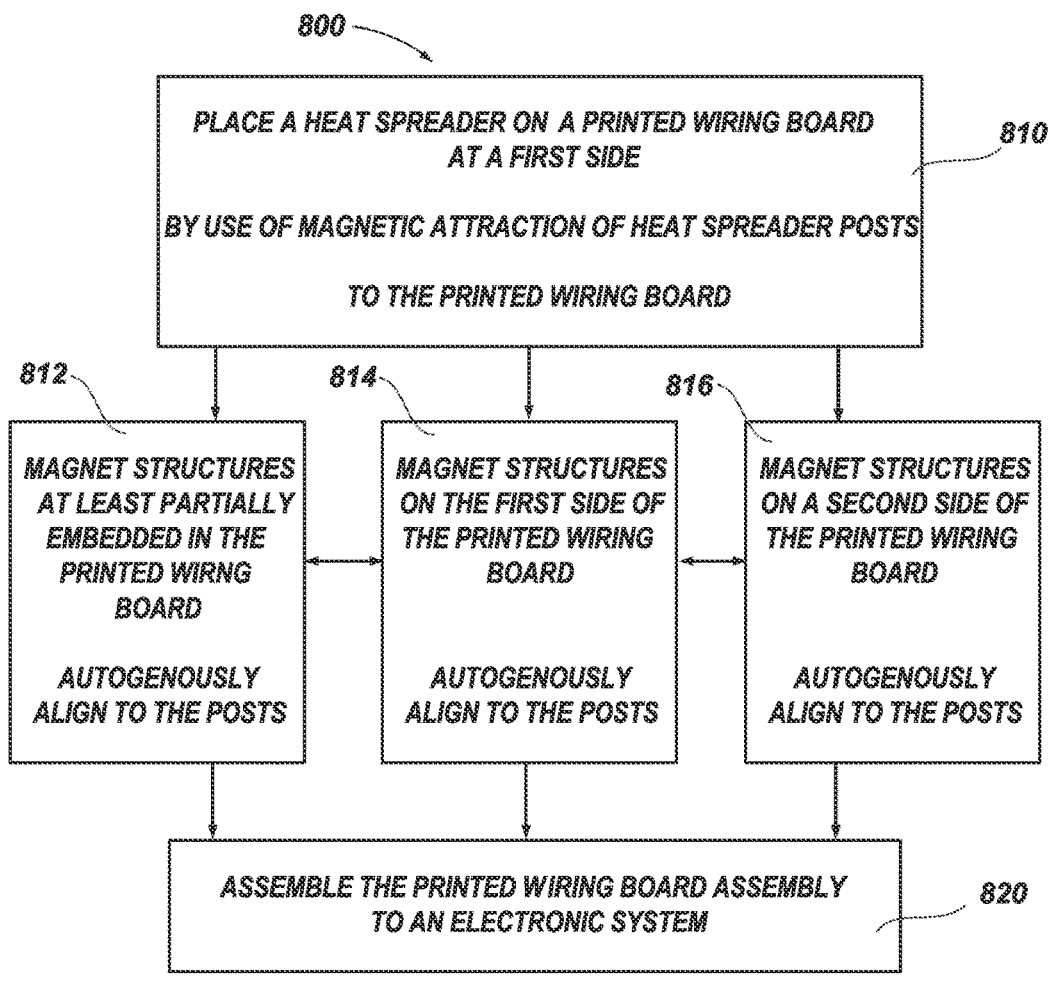

PLACE A HEAT SPREADER ON A PRINTED WIRING BOARD AT A FIRST SIDE

BY USE OF MAGNETIC ATTRACTION OF HEAT SPREADER POSTS

TO THE PRINTED WIRING BOARD

810

812

MAGNET STRUCTURES AT LEAST PARTIALLY EMBEDDED IN THE PRINTED WIRNG BOARD

AUTOGENOUSLY ALIGN TO THE POSTS

814

MAGNET STRUCTURES ON THE FIRST SIDE OF THE PRINTED WIRING BOARD

AUTOGENOUSLY ALIGN TO THE POSTS

816

MAGNET STRUCTURES ON A SECOND SIDE OF THE PRINTED WIRING BOARD

AUTOGENOUSLY ALIGN TO THE POSTS

ASSEMBLE THE PRINTED WIRING BOARD ASSEMBLY TO AN ELECTRONIC SYSTEM

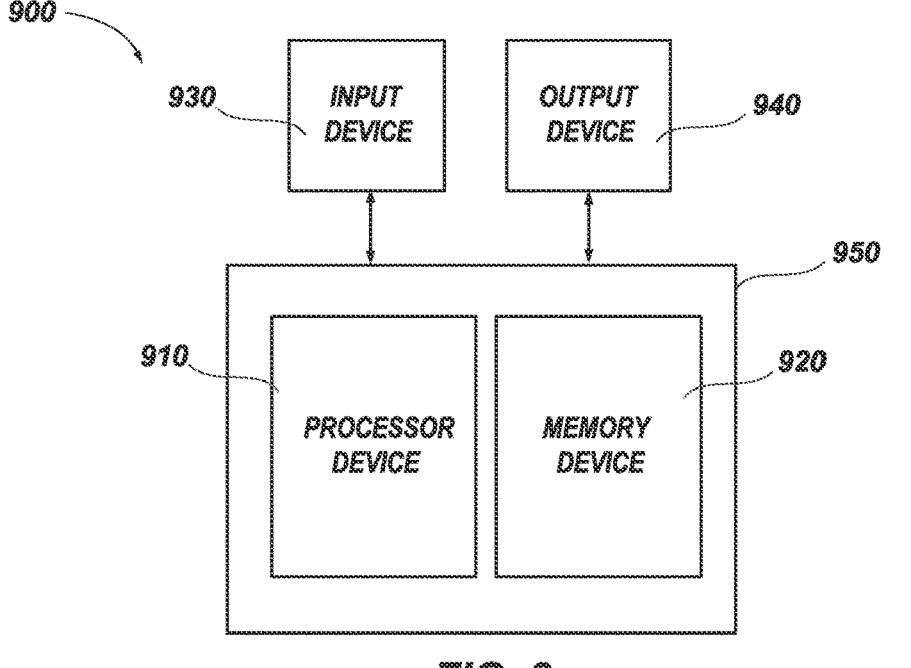

900

930  INPUT DEVICE

OUTPUT DEVICE  940

950

910  PROCESSOR DEVICE

MEMORY DEVICE  920

*FIG. 9*

HEAT SPREADER APPARATUS WITH MAGNETIC ATTACHMENTS ON PRINTED WIRING BOARD ASSEMBLIES, RELATED METHODS AND ELECTRONIC SYSTEMS

TECHNICAL FIELD

The disclosure, in various embodiments, relates generally to the field of integrated circuit device substrate assemblies including heat management features for components on the integrated circuit device substrate assemblies. More specifically, the disclosure relates to magnetic connectors between heat management structures and printed wiring board assemblies for components mounted on integrated circuit device substrates, related methods of fabrication and electronic systems.

BACKGROUND

Integrated circuit devices may be mounted on printed wiring boards such as mother boards and microelectronic device package boards. Heat management of components associated with printed wiring boards, may involve thermal expansion of structures including heat spreaders and microelectronic devices. Unfortunately, thermal expansion of structures may impose stresses upon the printed wiring boards, the electrical connections, and interfaces between heat spreaders and the integrated circuit devices.

BRIEF DESCRIPTION OF THE DRAWINGS

FIG. 8 is a simplified method flow diagram for a process of forming metallic material within a recess, according to embodiments of the disclosure.

FIG. 9 is a block diagram of an electronic system, according to embodiments of disclosure.

DETAILED DESCRIPTION

Figures 1A, 1B, 1C:
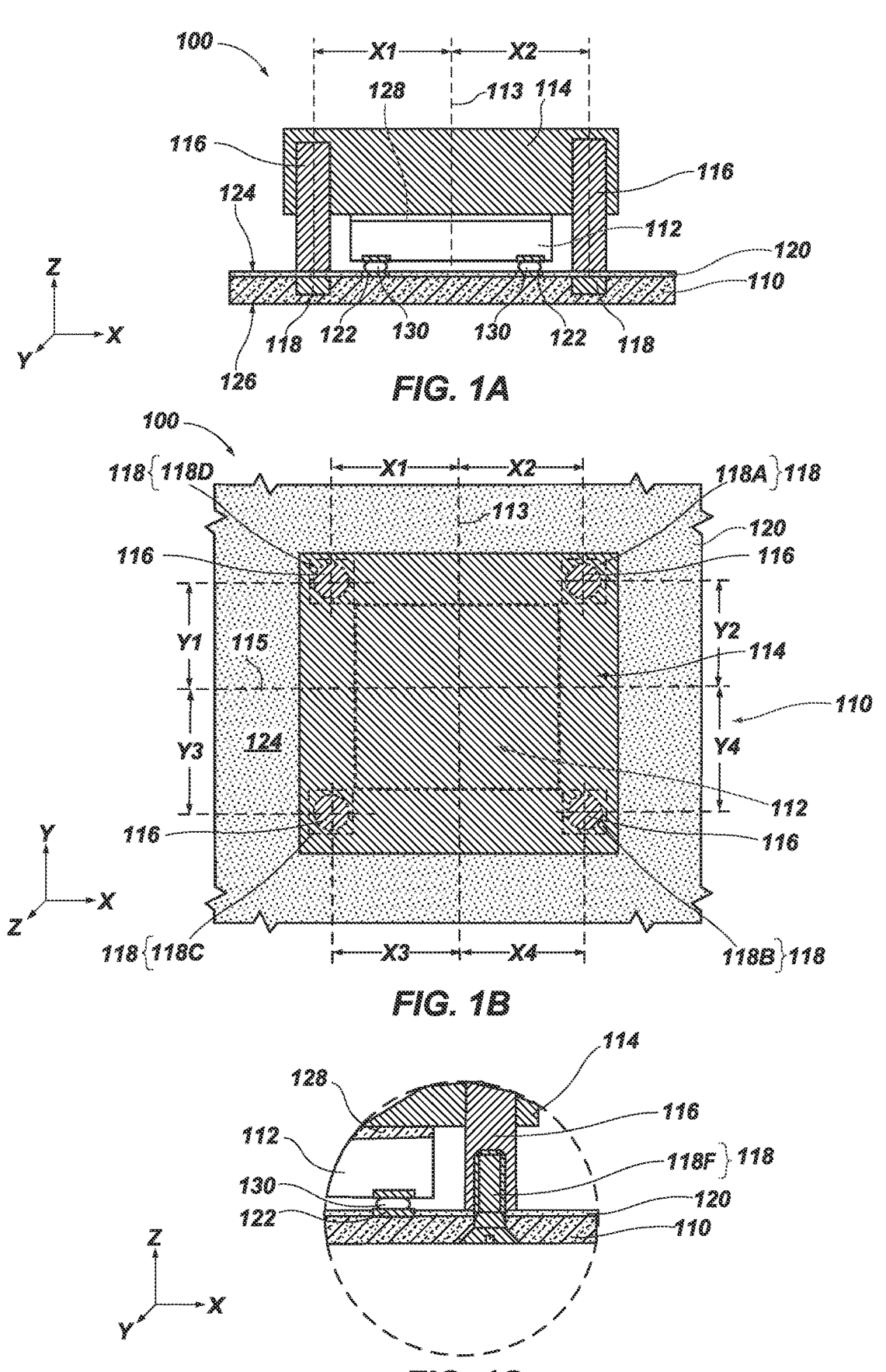
FIG. 1A is a simplified, longitudinal cross-section view of a portion of a semiconductor device package substrate assembly, in accordance with several embodiments of the disclosure.
FIG. 1B is a simplified, top plan view of the printed wiring board assembly 100 illustrated in FIG. 1A, according to several embodiments of the disclosure.
FIG. 1C is a simplified, longitudinal cross-section detail section taken from the printed wiring board assembly in FIGS. 1A and 1B, according to several embodiments of the disclosure.

Integrated circuit devices such as active microelectronic devices, including processors and memory, require both a footprint on a board such as a printed wiring board, as well as thermal management features. These thermal management features are particularly useful for processors such as central processing units (CPUs), graphics processing units (GPUs), radio frequency processors (RFPs), as well as for memory devices such as 3D NAND memory devices and DRAM memory devices, and others.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device package substrate fabrication techniques employed in the industry. In addition, the description provided below does not form a complete process flow for manufacturing thermal management features for microelectronic device package substrates (e.g., a package substrate for a memory device, a package substrate for an integrated-circuit device, a package substrate for a disaggregated-die integrated circuit device). The structures described below do not form a complete microelectronic device package substrate. However, those process acts and structures are useful to understand the embodiments of the disclosure are described in detail below. Additional acts to form complete thermal management features for microelectronic device package substrates from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation. Moreover, reference numbers may be incremented among drawings where like reference numbers may refer to like structures.

As used herein, the term "printed wiring board" refers to a board for mounting electronic device components, such as a motherboard or printed circuit board (PCB), and the printed wiring board includes electrical traces, contact vias, and contact pads for coupling electronic device components onto the printed wiring board.

As used herein, the term "package substrate" or "package board" refers to a printed wiring board for mounting a microelectronic device such as a processor microelectronic device or at least one memory microelectronic device, and the package substrate or package board may be in turn mountable upon a larger printed wiring board such as a motherboard. A package substrate or package board may be part of a printed wiring board assembly with thermal management features that are coupled to the board by magnet structures.

As used herein, a "memory device" means and includes microelectronic devices exhibiting memory functionality, but not necessarily limited to memory functionality. Stated another way, and by way of non-limiting example only, the term "memory device" includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, the term "integrated circuit" or "integrated-circuit device" may refer to a "microelectronic device" or a "nanoelectronic device," each of which may be tied to a critical dimension exhibited by inspection. The term "integrated circuit" includes without limitation a memory device, as well as other devices (e.g., semiconductor devices) which may or may not incorporate memory. The term "integrated circuit" may include without limitation a logic device. The term "integrated circuit" may include without limitation a processor device such as a central-processing unit (CPU) or a graphics-processing unit (GPU). The term "integrated circuit" may include without limitation or a radiofrequency (RF) device. Further, an "integrated-circuit" device may incorporate memory in addition to other functions such as, for example, a so-called "system on a chip" (SoC) including a processor and memory, or an integrated-circuit device including logic and memory. Further, an "integrated-circuit" device may incorporate memory in addition to other functions such as, for example, a so-called "disaggregated-die device" where distinct integrated-circuit components are associated to produce the higher function such as that of an SoC, including a processor alone, a memory alone, a processor and a memory, or an integrated-circuit device including logic and memory. A disaggregated-die device may be a system-in-package (SiP) assembly that includes at least two of at least one logic processor, at least one graphics processor, at least one memory device such as a 3-dimensional NAND memory device, at least one radio-frequency device, at least one analog device such as a capacitor, an inductor, a resistor, a balun, and these several at least one SiP devices, among others, may be assembled and connected with at least one embedded, multi-die interconnect bridge (EMIB) device, and at least two of the devices may be coupled with through-silicon via (TSV) technologies.

As used herein, the term "configured" refers to a size, shape, material composition, orientation, and arrangement of one or more of at least one structure and at least one apparatus facilitating operation of one or more of the structure and the apparatus in a pre-determined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis. Further as used herein, a gate width direction may be presented as a "W" axis in a CMOS device, where the Y-axis is supplanted with the W-axis to indicate the direction of a gate width.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure). The phrase "coupled to" may also refer to thermal-management connection between two structures or between a structure and a device such as a microelectronic device component.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiOxN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

As used herein, "semiconductor substrate" means a construction including semiconductive material, including, but not limited to, a bulk semiconductive material, such as a semiconductive wafer (either alone or in an assembly including other materials), and/or semiconductive material layers or characteristic structures (either alone or in an assembly comprising other materials). The term "substrate" refers to any supporting structure, including, but not limited to, the semiconductor substrates described above. In some applications the substrate may be a semiconductor substrate containing one or more materials associated with integrated circuit fabrication. Such materials may include, for example, one or more of refractory metal materials, barrier materials, diffusion materials, and insulator materials.

Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

FIG. 1A is a simplified, longitudinal cross-section view of a portion of a printed wiring board assembly 100 (also referred to herein as a "semiconductor device mounting substrate assembly" or a "printed circuit board assembly" (PCBA)) including thermal management features, according to embodiments of the disclosure. The printed wiring board assembly 100 may include a printed wiring board 110, which is also referred to herein as a "memory-module board" or a "printed wiring board." Materials of the printed wiring board 110 may include a composite construction such as an FR4 (flame retardant epoxy resin and glass fabric composite) assembly, among other structures.

Still referring to FIG. 1A, a microelectronic device component 112 may be mounted on the printed wiring board 110 where the microelectronic device component 112 may be configured as a flip-chip microelectronic device component 112. The microelectronic device component 112 may make thermal communication to a heat spreader 114. The heat spreader 114 may be fashioned from a material such as aluminum, and may be fabricated such as by metal stamping. The heat spreader 114 may be physically coupled to the printed wiring board 110 by posts 116. In some embodiments, the heat spreader 114 is magnetically and physically coupled to the printed wiring board 110, where the posts 116 are ferromagnetic, and where magnet structures 118 may be associated with the printed wiring board 110, and where the magnet structures 118 effect a ferromagnetic attractive force on the posts 116 to hold the post 116. The magnet structures 118 impose a magnetic attractive force upon the posts 116, and thereby the heat spreader 114 is affixed against the microelectronic device component 112. In some embodiments, the magnet structures 118 are at least partially embedded within the printed wiring board 110. In some embodiments, the posts 116 are separated from the magnet structures 118 by insulative material such as a solder resist material 120 that may be incidental and intermittent structure such as for conductive material that is array bond pads 122 on the printed wiring board 110. In some embodiments, the magnet structures 118 are positioned between a first side 124 of the printed wiring board 110, and a second side 126, in an at least partially embedded configuration. The first side 124 may also be referred to as a top side 124, and also as a die side 124. The second side 126 may also referred to as a bottom side 126, and also as a land side 126, where the first side 124 is opposite the second side 126.

Still referring to FIG. 1A, in some embodiments, a material such as the solder resist material 120 intervenes between the magnet structures 118 and the posts 116, and the material of the solder resist material 120 provides a lower lateral-sliding (X-Y) slipping surface for the posts 116 that are under ferromagnetic attraction by magnet structures 118, than where the posts 116 would otherwise make direct contact with the magnet structures 118.

Still referring to FIG. 1A, a thermal interface material (TIM) 128 is between the microelectronic device component 112 at a back side and the heat spreader 114. In addition, electrical bumps 130 are on an active side of the microelectronic device component 112, and contact array bond pads 122 at the die side 124 of the printed wiring board 110. The magnet structures 118 retain the ferromagnetic posts 116 on the die side 124 by ferromagnetism, such that the posts 116 are principally (e.g., solely) affixed at the die side 124 by way of the embedded magnet structures 118.

Still referring to FIG. 1A, during assembly of the heat spreader 114 to the printed wiring board 110 and onto the microelectronic device component 112, a pick-and-place technique may be used. As the posts 116 are brought within registration proximity with the magnet structures 118, ferromagnetic autogenous registration of the ferromagnetic posts 116 occurs above and proximate the magnet structures 118. During disassembly techniques, a large magnet may be brought from the first side 124 where magnetic poles are aligned in repulsion with the magnet structures 118, and the heat spreader 114 is released by a net repulsive force upon the magnet structures 118. Further, after assembly of the heat spreader 114 onto the TIM 128 as well as onto the printed wiring board 110, the magnet structures 118 hold the posts 116 onto the printed wiring board under sufficient force to resist undesirable shift of the heat spreader 114, including undesirable separation of the heat spreader 114 from the printed wiring board 110. Consequently, the printed wiring board assembly 100 is useful in field-use applications, and the heat spreader 114 may be removed from the printed wiring board 110 with deliberate effort for reworking the printed wiring board assembly 100.

Still referring to FIG. 1A, during field use of the microelectronic device component 112, where heat is generated in the microelectronic device component 112 and generated heat is transferred through the TIM 128 into the heat spreader 114, thermal-expansion stresses may cause the heat spreader 114 to expand at least in two dimensions (X-Y) laterally above and across the first side 124 of the printed wiring board 110. Thermal expansion of other structures, however, is experienced, beginning with structures of the microelectronic device component 112, and the TIM 128, as well as the electrical bumps 130. Consequently, stresses at the electrical bumps 130 may cause heat-cycle fatigue stresses between the electrical bumps 130 and the array bond pads 122, but disclosed embodiments may lessen heat-cycle expansion fatigue at the electrical bumps 130, as well as within the printed wiring board 110. In some embodiments, although at least some of the posts 116 may slide laterally during heat-up cycling, when the heat spreader 114 cools and contracts to a room-temperature state, the magnet structures 118 may draw the posts 116 to pre-heating positions. In some embodiments, lateral movement of some of the posts 116 during thermal cycling may be in a range of from about 0.5 mm to about 2 mm from a room-temperature, original position that is centered on magnetic flux lines of a given magnet structure 118.

In some embodiments, materials (e.g., thermal grease) are chosen for the TIM 128 such that when thermal expansion of the heat spreader 114 is experienced, substantially no thermal-cracking stress between the microelectronic device component 112 and the heat spreader 114 is effectuated. In some embodiments where the TIM 128 is metallic and thermal load is generated by the microelectronic device component 112 at expected temperatures, the TIM 128 exhibits a more ductile ability to complement thermal expansion of the heat spreader 114 than that of the electrical bumps 130. Accordingly, a relatively lower sheer stress is effectuated between the heat spreader 114 and the microelectronic device component 112, as well as relatively lower stresses between the electrical bumps 130 and the array bond pads 122. Consequently, the electrical bumps 130 may exhibit a longer service life since significant thermal expansion stresses are imparted on the electrical bumps 130 by the heat spreader 114. In addition, where the posts 116 are able to slide in two dimensions (X-Y), although the posts 116 are held against the printed wiring board 110 at the first side 124, thermal expansion stresses are lowered between the posts 116 and the first side 124 of the printed wiring board 110. In some embodiments, although the magnet structures 118 hold the posts 116 against the first side 124, thermal expansion of the heat spreader 114 allows for lateral (X-Y) slippage of the posts 116. The magnetic attractive force of the magnet structures 118 holds (e.g., retains, affixes) the posts 116 upon the first side 124, and thermal stresses at the electrical bumps 130 are relatively lower than if the posts 116 were affixed differently to the printed wiring board 110, such as by fasteners, clips, and/or screws.

Still referring to FIG. 1A, placement of the posts 116 in relation to the printed wiring board first side 124 may be varied depending upon wiring densities and complexities in relation to the microelectronic device component 112. In some embodiments, a first symmetry line 113 for the microelectronic device component 112 bilaterally bisects the microelectronic device component 112; and a first-direction (X-direction), first lateral distance X1 defines a distance from the first symmetry line 113 to a center location of a given post 116. Similarly, a first direction, second lateral distance X2 may define a second distance from the first symmetry line 113 to a center location of a given post 116. In some embodiments, the first direction, first lateral distance X1 and the first direction, second lateral distance X2 are substantially the same. In some embodiments, the first direction, first lateral distance X1 and the first direction, second lateral distance X2 are different, depending upon useful available area where posts 116 and magnet structures 118 may be aligned.

FIG. 1B is a simplified, top plan view of the printed wiring board assembly 100 illustrated in FIG. 1A, according to some embodiments. The heat spreader 114 is illustrated above the first side 124 of the printed wiring board 110, and the posts 116 (four occurrences) are also illustrated as being positioned below the heat spreader 114 by way of dashed lines. Similarly below the heat spreader 114 and each of the posts 116, four occurrences of the magnet structures 118 are illustrated by way of additional dashed lines, including a first magnet structure 118A, a second magnet structure 118B, a third magnet structure 118C, and a fourth magnet structure 118D. Each magnet structure 118 individually vertically underlies and horizontally overlaps one of the posts 116.

In some embodiments, the one of the magnet structures 118 (e.g., the first magnet structure 118A) imparts a higher magnetic attractive force (magnetic flux density) on the post 116 associated therewith (e.g., vertically above and within an horizontal area thereof) than the magnetic attractive forces imparted on others of the posts 116 associated with others of the magnet structures 118 (e.g., the second magnet structure 118B, the third magnet structure 118C, and the fourth magnet structure 118D). During thermal load induced upon the heat spreader 114 by the microelectronic device component 112, the position of the post 116 associated with the one of the magnet structures 118 (e.g., the first magnet structure 118A) moves laterally (X-Y) less, if at all, than the positions of the posts 116 above each of the others of magnet structures 118 (e.g., the second magnet structure 118B, the third magnet structure 118C, and the fourth magnet structure 118D). Consequently, during thermal expansion of the heat spreader 114, although the heat spreader 114 may expand at least in two dimensions (X-Y), the post 116 associated with the one of the magnet structures 118 is substantially held in place, while the posts 116 associated with the others of the magnet structures 118 are allowed to slip laterally in up to two dimensions. However, the posts 116 above the others of the magnet structures 118 retain heat spreader 114 against the microelectronic device component 112. Consequently, thermal-expansion stress from the heat spreader 114, is lowered, both for stresses imposed upon the electrical bumps 130 and upon the printed wiring board 110.

Still referring to FIG. 1B, in some embodiments, the two of the magnet structures 118 (e.g., the first magnet structure 118A and the second magnet structure 118B) impart relatively higher magnetic attractive forces upon the posts 116 associated therewith (e.g., vertically above and within horizontal areas thereof), than the magnetic attractive forces imparted on others of the posts 116 associated with other of the magnet structures 118 (e.g., the third magnet structure 118C and the fourth magnet structure 118D). During thermal load induced upon the heat spreader 114 by the microelectronic device component 112, the positions of the posts 116 associated with the two of the magnet structures 118 (e.g., the first magnet structure 118A and the second magnet structure 118B) move laterally (e.g., X direction) less, if at all, than the positions of the posts 116 associated with the others of the magnet structures 118 (e.g., the third magnet structure 118C and the fourth magnet structure 118D). Consequently, during thermal expansion of the heat spreader 114, although the heat spreader 114 may expand at least in two dimensions (X-Y), the posts 116 associated with the two of magnet structures 118 may be substantially held in place, while the posts 116 associated with the others of the magnet structures 118 may be allowed to slip laterally in up to two dimensions. Consequently, thermal-expansion stress from the heat spreader 114 may be lowered, both for stresses imposed upon the electrical bumps 130 and for stresses imposed upon the printed wiring board 110.

Still referring to FIG. 1B, placement of the posts 116 in relation to the printed wiring board first side 124 may be varied depending upon wiring densities and complexities in relation to the microelectronic device component 112. In some embodiments, the first symmetry line 113 is coupled with a second symmetry line 115. The first symmetry line 113 and the second symmetry line 115 may bilaterally bisect the microelectronic device component 112 in a first horizontal direction (X-direction) and a second horizontal direction (Y-direction), respectively. In addition to the first direction, first lateral distance X1 and the first direction, second lateral distance X2, a first direction, third lateral distance X3 and a first direction, fourth lateral distance X4 may each be useful to define locations of corresponding posts 116. Furthermore, a second direction, first lateral distance Y1 and a second direction, second lateral distance Y2, a second direction, third lateral distance Y3 and a second direction, fourth lateral distance Y4 may each also be useful to define locations of corresponding posts 116. In some embodiments, the heat spreader 114 has a peripheral horizontal cross-sectional shape that is substantially square, such that all peripheral lateral dimensions are substantially equal to one another. In some embodiments, the heat spreader has a peripheral horizontal cross-sectional shape that is non-square but substantially rectangular. For example, the first direction distances (e.g., X1, X2, X3, and X4) may substantially the same as one another; and the second direction distances (e.g., Y1, Y2, Y3, and Y4) are substantially the same as one another, but different than the first direction distances. In some embodiments, the heat spreader 114 has a different peripheral horizontal cross-sectional shape, such as a trapezoidal shape. In an embodiment in this instance, some of the magnet structures 118 and some of the posts 116 are substantially uniformly spaced, but at least one magnet structure 118 (e.g., the first magnet structure 118A) is located differently where useful and available real estate on the printed wiring board 110 is available.

FIG. 1C is a simplified, longitudinal cross-section detail section taken from the printed wiring board assembly 100 in FIGS. 1A and 1B, according to several embodiments. Where a given location may be selected, such as for the position in FIG. 1B of the second magnet structure 118B, a fastener 118F (e.g., a mechanical fastener, such as a clip, screw, or rivet) makes physical contact with a post 116, through the printed wiring board 110. The fastener 118F may substitute for, e.g., the second magnet structure 118B, and the other three magnet structures 118A, 118C, and 118D may remain.

Although the fastener 118F affixes the corresponding post 116 through the printed wiring board 110, the fastener 118F may form an immovable attachment between the heat spreader 114 and the printed wiring board 110. The other magnet structures 118A, 118C, and 118D may still allow for lateral slip expansion of the heat spreader 114 under thermal load from the microelectronic device component 112.

In additional embodiments, the printed wiring board assembly 100 may be formed to have a different configuration than that previously described with reference to FIGS. 1A through 1C. The printed wiring board assembly 100 may, for example, be formed to exhibit a configuration such as one of the configurations depicted in FIGS. 2 through 7 and described in further detail below. With the description provided below, it will be readily apparent to one of ordinary skill in the art that the structures and devices described herein may be included in relatively larger structures, devices, and systems.

Figure 2:
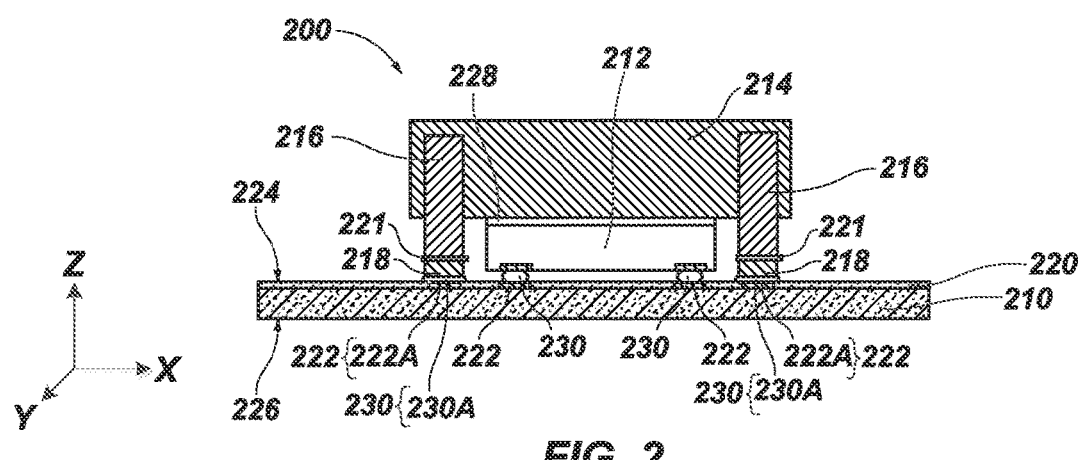
FIG. 2 is a simplified, longitudinal cross-section view of a portion of a printed wiring board assembly, according to several embodiments of the disclosure.

Before referring to FIG. 2, it will be understood that throughout FIGS. 2 through 7 and the associated description, features (e.g., regions, materials, structures, devices) functionally similar to previously described features (e.g., previously described materials, structures, devices) are referred to with similar reference numerals incremented by 100. To avoid repetition, not all features shown in FIGS. 2 through 7 are described in detail herein. Rather, unless described otherwise below, a feature in one or more of FIGS. 2 through 7 designated by a reference numeral that is a 100 increment of the reference numeral of a feature previously described with reference to one or more of FIGS. 1A through 1C will be understood to be substantially similar to and have substantially the same advantages as the previously described feature. In addition, unless described otherwise below, a feature in one or more of FIGS. 3 through 7 designated by a reference numeral that is a 100 increment of the reference numeral of a feature previously described with reference to a preceding one or more of FIGS. 2 through 7 will be understood to be substantially similar to and have substantially the same advantages as the previously described feature. As a non-limiting example, unless described otherwise below, features designated by the reference numerals 220, 320, 420, 520, 620, and 720 in FIGS. 2 through 7, respectively, will be understood to respectively be substantially similar to and have substantially the same advantages as the solder resist material 120 previously described herein with reference to FIGS. 1A through 1C.

FIG. 2 is a simplified, longitudinal cross-section view of a portion of a printed wiring board assembly 200, according to several embodiments of the disclosure. The printed wiring board assembly 200 may be similar to the printed wiring board assembly 100 previously described with reference to FIGS. 1A through 1C, except that, for example, the magnet structures 218 are affixed on the first side 224 of the printed wiring board 210 rather than being embedded within the printed wiring board 210. In some embodiments, the magnet structures 218 are surface mounted on a first side 224 (that is above and opposite the second side 226) by way of solder paste 230A. The solder paste 230A may be screen-printed onto bond pads 222A of the printed wiring board 210 at the same time as solder paste is assembled to form electrical bumps 230 onto the bond pads 222. In additional embodiments, the magnet structures 218 are bonded to the first side 224 of the printed wiring board 210 by way of an adhesive, such as a resin material. In addition, in some embodiments, the posts 216 are separated from the magnet structures 218 by a low-friction material 221 that may intervene therebetween, and that allows the ferromagnetic attractive force of the magnet structures 218 on the posts 216, but also allows for lateral (X-Y) sliding between the magnet structures 218 and the posts 216 during incidental thermal expansion of the heat spreader 214. With the low-friction material 221 between the magnet structures 218 and the posts 216, the posts 216 may be slidingly coupled to the magnet structures 218 principally (e.g., solely) by way of ferromagnetic attraction.

Figure 3:
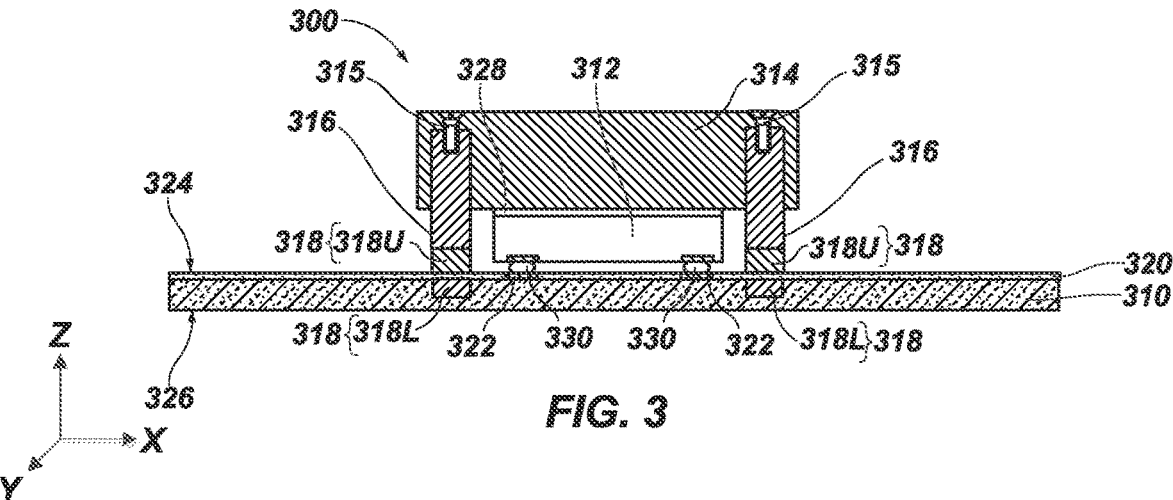
FIG. 3 is a simplified, longitudinal cross-section view of a portion of a printed wiring board assembly including thermal management features, according to several embodiments of the disclosure.

FIG. 3 is a simplified, longitudinal cross-section view of a portion of a printed wiring board assembly 300 including thermal management features, according to embodiments of the disclosure. The printed wiring board assembly 300 may be similar to the printed wiring board assembly 100 previously described with reference to FIGS. 1A through 1C, except that, for example, the posts 316 have magnetic ends of upper magnet structures 318U, and ferromagnetic material 318L is embedded within the printed wiring board 310 and operatively associated with the magnetic ends of upper magnet structures 318U of the posts 316. In some embodiments, upper magnet structures 318U form the magnetic ends of upper magnet structures 318U of the posts 316; and the lower magnet structures 318L are the ferromagnetic material 318L of the printed wiring board 310. The upper magnet structures 318U and the lower magnet structures 318L may together effectively from magnet structures 318 of the printed wiring board assembly 300. In some embodiments, the upper magnet structures 318U are natural magnets, and the lower magnet structures 318L are ferromagnetic material such as mild steel. In some embodiments, the heat spreader 314 and the posts 316 may be assembled with fasteners 315 such as a threaded bolt. A threaded bolt may be used to assembly any of the disclosed heat spreaders.

The upper magnet structures 318U and the lower magnet structures 318L may each be magnetic, such that magnetic poles are north-south (N-S) are aligned between the upper magnet structures 318U and the lower magnet structures 318L to create a net attractive force between the upper magnet structures 318U and the lower magnet structures 318L. The upper magnet structures 318U share an attractive force with the lower magnet structures 318L, and the posts 316 are pulled toward the lower magnet structures 318L such that the heat spreader 314 is affixed against the printed wiring of microelectronic device component 312 and against the first side 324 of the printed wiring board 310. The posts 316 may be principally (e.g., solely) affixed at the die side 324 of the printed wiring board 310 by virtue of the upper and lower magnet structures 318U and 318L.

In some embodiments, the upper magnet structures 318U are separated from the lower magnet structures 318L by solder resist material 320. The solder resist material 320 may be an incidental structure, such as for protecting the printed wiring board 310, while exposing array bond pads 322 on the printed wiring board 310. The solder resist material 320 may provide a lower lateral (X-Y) slipping surface for the posts 316 under ferromagnetic attraction by magnet structures 318 than where the upper magnet structure 318U would otherwise make direct physical contact with the lower magnet structures 318L. In some embodiments, although at least some of the posts 316 may slide laterally during heat-up cycling, when the heat spreader 314 cools and contracts to a room-temperature state, the magnet structures 318U and 381L draw the posts 316 to pre-heating positions. In some embodiments, lateral movement of some of the posts 316 is within a range of from about 0.5 mm to about 2 mm from a room-temperature original position that is centered on magnetic flux lines of a given magnet structure 318.

During assembly of the heat spreader 314 to the printed wiring board 310 and onto the microelectronic device component 312, a pick-and-place technique may be used. As the posts 316 including upper magnet structures 318U are brought within registration proximity with the lower magnet structures 318L within the printed wiring board 310, magnetic autogenous registration of the posts 316 above and horizontally aligned with the lower magnet structures 318L occurs. During disassembly techniques, a large magnet may be brought from the second side 326 where magnetic poles are aligned in repulsion with the upper magnet structures 318U, and the heat spreader 314 is released by a net repulsive force upon the upper magnet structures 318U. Further, after assembly of the heat spreader 314 onto the TIM 328 as well as onto the printed wiring board 310, the magnet structures 318 hold the posts 116 onto the printed wiring board 310 under sufficient force to resist undesirable shift of the heat spreader 314, including undesirable separation of the heat spreader 314 from the printed wiring board 310. Consequently, the printed wiring board assembly 300 is useful in field-use applications, and the heat spreader 314 may be removed from the printed wiring board 310 with deliberate effort for reworking the printed wiring board assembly 300.

Figure 4:
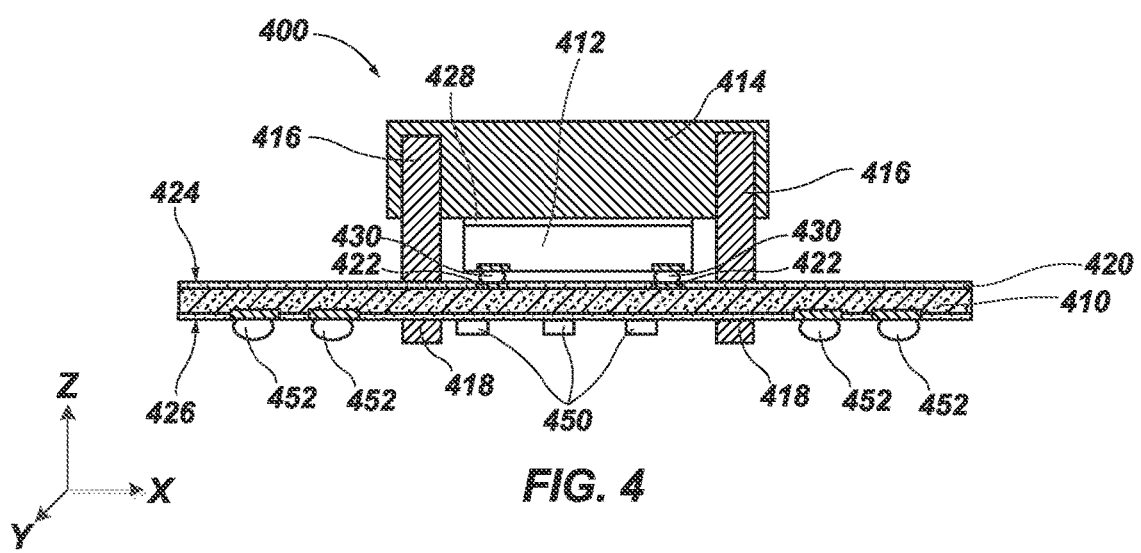
FIG. 4 is a simplified, longitudinal cross-section view of a portion of a printed wiring board assembly including thermal management features, according to embodiments of the disclosure.

FIG. 4 is a simplified, longitudinal cross-section view of a portion of a printed wiring board assembly 400 including thermal management features, according to embodiments of the disclosure. The printed wiring board assembly 400 may be similar to the printed wiring board assembly 100 previously described with reference to FIGS. 1A through 1C, except that, for example, the magnet structures 418 are affixed on the second side 426 (opposite the first side 424) of the printed wiring board 410 rather than being embedded within the printed wiring board 410. In some embodiments, the magnet structures 418 directly vertically underlie a volume of solder resist material 420 at least partially defining the second side 426 of the printed wiring board 410. In addition, the posts 416 may directly vertically overlie an additional volume of the solder resist material 420 at least partially defining the first side 424 of the printed wiring board 410.

As shown in FIG. 4, the printed wiring board assembly 400 may also include second-side components 450 located on the second side 426 of the printed wiring board 410. The second-side components 450 may vertically underlie and at least partially horizontally overlap the microelectronic device component 412 (which overlies the first side 424 of the printed wiring board 410). The second-side components 450 may be passive devices, such as decoupling capacitors to service the microelectronic device component 412, inductors, resistors, and other passive devices. In some embodiments where the printed wiring board 410 is a printed wiring board 410 with a first side 424 (e.g., die side) and a second side 426 (e.g., land side), the second-side components 450 (e.g., land-side components) may be "opossum" mounted on the second side 426, along with the magnet structures 418. In addition, second-side electrical bumps 452 may be selected, positioned, and sized to allow vertical clearance for each of the second-side components 450 and the magnet structures 418.

Figure 5:
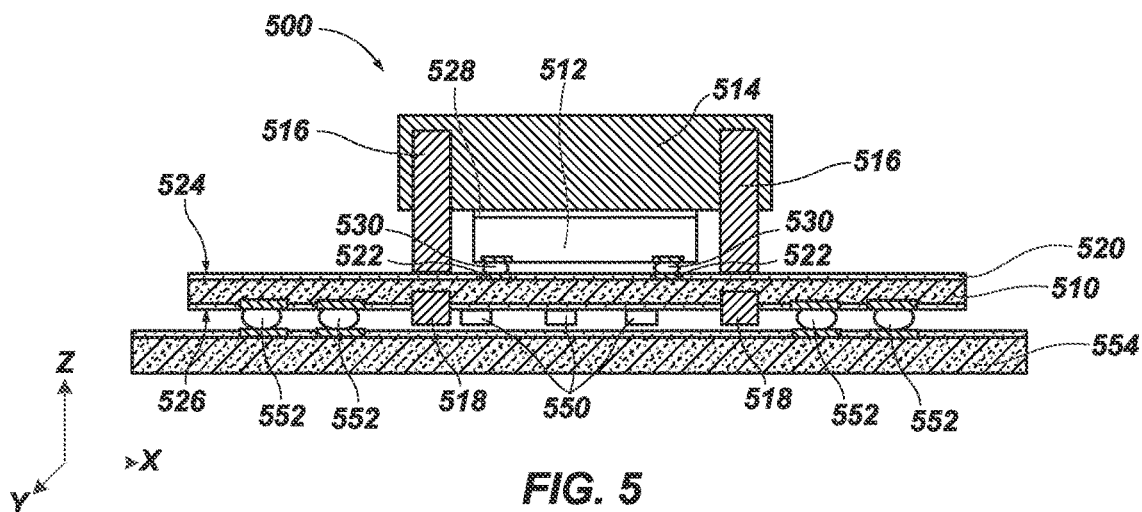
FIG. 5 is a simplified, longitudinal cross-section view of a portion of a printed wiring board assembly including thermal management features, according to embodiments of the disclosure.

FIG. 5 is a simplified, longitudinal cross-section view of a portion of a printed wiring board assembly 500 including thermal management features, according to embodiments of the disclosure. The printed wiring board assembly 500 may be similar to the printed wiring board assembly 400 previously described with reference to FIG. 4, except that, for example, the magnet structures 518 vertically extend into the printed wiring board 510 from the second side 526 (opposite the first side 524) thereof the printed wiring board 510. The magnet structures 518 may be partially embedded within the printed wiring board 510, so as to include portions within the printed wiring board 510 and additional portions vertically underlying the printed wiring board 510. In some embodiments, the magnet structures 518 directly vertically extend through a volume of solder resist material 520 at least partially defining the second side 526 of the printed wiring board 510. The posts 516 may directly vertically overlie an additional volume of the solder resist material 520 at least partially defining the first side 524 of the printed wiring board 510.

As shown in FIG. 5, the printed wiring board assembly 500 may further include an additional board 554 (e.g., motherboard) vertically underlying the printed wiring board 510, and second-side components 550 (e.g., passive devices, such as decoupling capacitors, inductors, resistors) interposed between the second side 526 of the printed wiring board 510 and the additional board 554. The second-side components 550 may vertically underlie and at least partially horizontally overlap the microelectronic device component 512 (which overlies the first side 524 of the printed wiring board 510). Land side electrical bumps 552 extend from and between bond pads of the printed wiring board 510 and the additional board 554, and may be selected and sized to allow vertical clearance for each of the second-side components 550 and the magnet structures 518.

Figure 6:
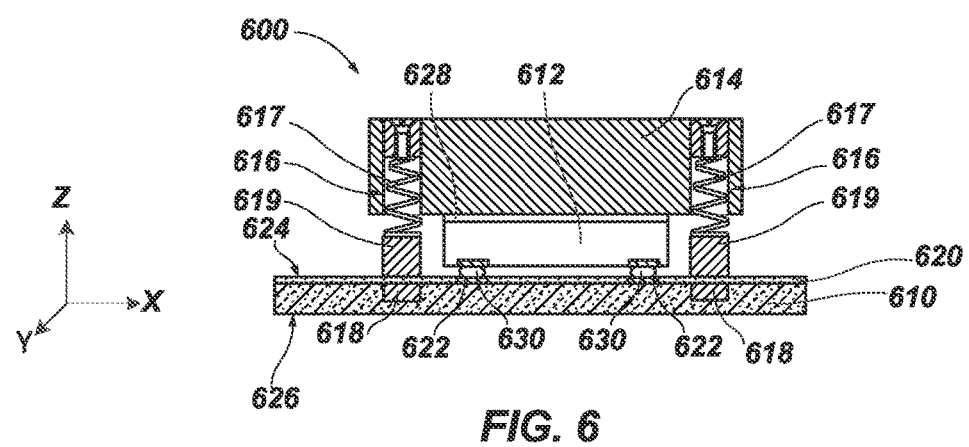
FIG. 6 is a simplified, longitudinal cross-section view of a portion of a printed wiring board assembly including thermal management features, according to embodiments of the disclosure.

FIG. 6 is a simplified, longitudinal cross-section view of a portion of a printed wiring board assembly 600 including thermal management features, according to embodiments of the disclosure. The printed wiring board assembly 600 may be similar to the printed wiring board assembly 100 previously described with reference to FIGS. 1A through 1C, except that, for example, the printed wiring board assembly 600 includes flexible posts 616 having ferromagnetic base portions 619. In some embodiments, the flexible posts 616 individually include a spring section 617 (also referred to as a flexible section 617) vertically overlying and coupled to the base portion 619 thereof. The base portions 619 of the flexible posts 616 may allow lateral-expansion (X-Y) of the spring sections 617 without significant slipping of the base portions 619 when the flexible posts 616 are under ferromagnetic attraction by the magnet structures 618. In some embodiments due to positioning of the magnet structures 618, although at least some of the spring sections 617 of the flexible posts 616 may expand laterally during heat-up cycling, when the heat spreader 614 cools and contracts to a room-temperature state, the spring sections 617 of the flexible posts 616 return to pre-heating positions and tensions.

As shown in FIG. 6, in some embodiments, the magnet structures 618 are at least partially embedded within the printed wiring board 610. In further embodiments, the magnet structures 618 are surface mounted on the first side 624 of printed wiring board 610, similar to the magnet structures 218 previously described with reference to FIG. 2. In addition, in some embodiments, the flexible posts 616 have magnetic ends (e.g., like the magnetic ends of upper magnet structures 318U previously described with reference to FIG. 3), and the magnet structures 618 include ferromagnetic material within the printed wiring board 610 (e.g., like lower magnet structures 318L previously described with reference to FIG. 3). In further embodiments, the magnet structures 618 are positioned at a second side 626 (e.g., like the magnet structures 418 illustrated in FIG. 4).

During assembly of the heat spreader 614 to the printed wiring board 610 and onto the microelectronic device component 612, a pick-and-place technique may be used. As the flexible posts 616 are brought within registration proximity with the magnet structures 618, ferromagnetic autogenous registration of the flexible posts 616 above and onto the magnet structures 618 occurs, where spring sections 617 of the flexible posts 616 allow base portion 619 of the flexible posts 616 to be drawn against the first side 624 by extension of the spring sections 617. Upon seating of the heat spreader 614 against the TIM 628, the spring sections 617 of the flexible posts 616 remain in tension. During disassembly techniques, a large magnet may be brought from the first side 624 where magnetic poles are aligned in repulsion with the magnet structures 618, and the heat spreader 614 is released by a net repulsive force upon the magnet structures 618. Further, after assembly of the heat spreader 614 onto the TIM 628 as well as onto the printed wiring board 610, the magnet structures 618 hold the flexible posts 616 onto the printed wiring board 610 under sufficient force to resist undesirable shift of the heat spreader 614, including undesirable separation of the heat spreader 614 from the printed wiring board 610. In some embodiments, a single magnet structure 618, of four magnet structures 618, is replaced with a fastener such as the fastener 118F depicted in FIG. 1C. Consequently, the printed wiring board assembly 600 is useful in field-use applications, whether with a fastener such as the fastener 118F depicted in FIG. 1C, or with four occurrences of magnet structure 118 as illustrated in FIG. 6, and the heat spreader 614 may be removed from the printed wiring board 110 with deliberate effort for reworking the printed wiring board assembly 600.

Figure 7:
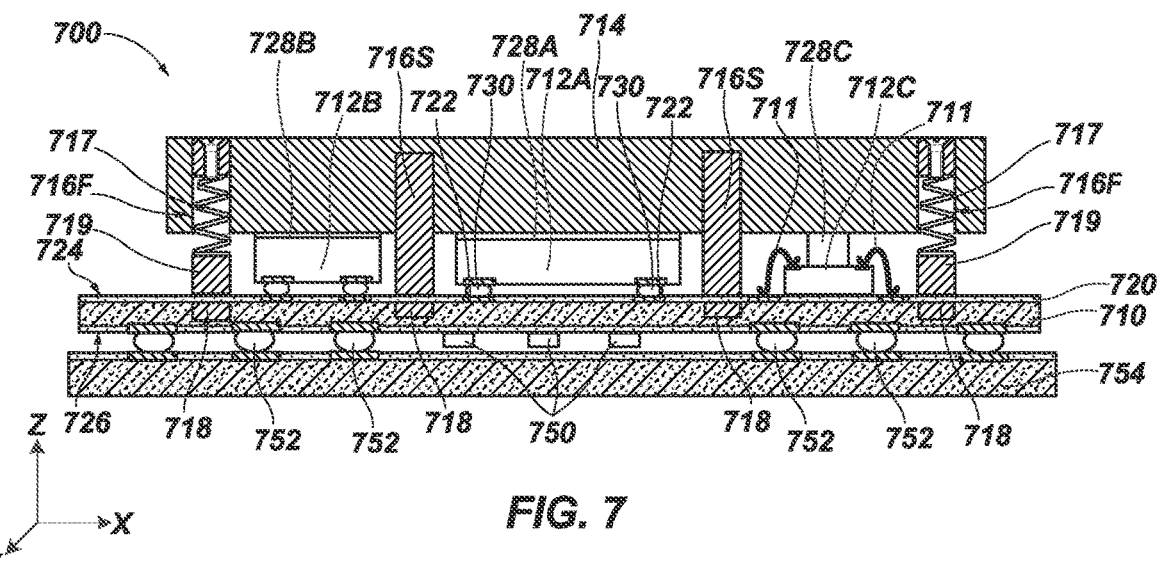
FIG. 7 is a simplified, longitudinal cross-section view of a portion of a printed wiring board assembly including thermal management features, according to embodiments of the disclosure.

FIG. 7 is a simplified, longitudinal cross-section view of a portion of a printed wiring board assembly 700 including thermal management features, according to embodiments of the disclosure. The printed wiring board assembly 700 may be formed to exhibit a combination of the features and feature arrangements of two or more of the printed wiring board assemblies 100, 200, 300, 400, 500, and 600 previously described with reference to FIGS. 1A through 1C and 2 through 6. For example, the printed wiring board assembly 700 may include a combination of features and feature arrangements of the printed wiring board assembly 100 (FIGS. 1A through 1C), the printed wiring board assembly 500 (FIG. 5), and the printed wiring board assembly 600 (FIG. 6), as well as additional features, as described in further detail below.

As shown in FIG. 7, a first microelectronic device component 712A may be located on the printed wiring board 710 (e.g., package board), and may be configured as a first flip-chip microelectronic device component. In addition, a second microelectronic device component 712B may also be located on to the printed wiring board 710, and may be configured as a second flip-chip microelectronic device component. Further, a third microelectronic device component 712C may also be located on the printed wiring board 710, and may be configured as a wire-bonded microelectronic device component. The microelectronic device components 712A, 712B, and 712C may individually be provided in thermal communication with a heat spreader 714, a first TIM 728A is interposed between the first microelectronic device component 712A and the heat spreader 714, a second TIM 728B is interposed between the second microelectronic device component 712B and the heat spreader 714, and an adaptor third TIM 728C is interposed between the wire-bonded subsequent microelectronic device component 712C and the heat spreader 714. The heat spreader 714 is thermally coupled to the third microelectronic device component 712C between bond wire connections 711. In some embodiments, the heat spreader 714 includes the adaptor third TIM 728C as an integral portion of the heat spreader 714, where fabrication may be done by aluminum metal stamping techniques.

Still referring to FIG. 7, the heat spreader 714 may be physically coupled to the printed wiring board 710 by posts 716, including solid posts 716S and flexible posts 716F. In some embodiments, the heat spreader 714 is magnetically and physically coupled to the printed wiring board 710. The solid posts 716S and parts of the flexible posts 716F are at least in part ferromagnetic, such as a base portions 719 of the flexible posts 716F. The magnet structures 718 may be associated with the printed wiring board 710. In some embodiments, the magnet structures 718 are at least partially embedded within the printed wiring board 710. The magnet structures 718 impose an attractive force upon the flexible posts 716F, and thereby the heat spreader 714 is affixed against the microelectronic device components 712A, 712B and 712C. In some embodiments, spring sections 717 and base portions 719 of the flexible posts 716F facilitate lateral-expansion (X-Y) of the spring sections 717 without significant slipping for base portions 719 during ferromagnetic attraction by the magnet structures 718.

In some embodiments, the flexible posts 716F and the solid posts 716S are separated from the magnet structures 718 by solder resist material 720. The solder resist material 720 may be an incidental structure, such as for array bond pads 722 on the printed wiring board 710. In some embodiments, the magnet structures 718 are positioned between a first side 724 of the printed wiring board 710 and a second side 726 of the printed wiring board 710, so as to be at least partially embedded within the printed wiring board 710.

Still referring to FIG. 7, during assembly of the heat spreader 714 to the printed wiring board 710 and onto the microelectronic device components 712A, 712B, and 712C, a pick-and-place technique may be used. As the solid posts 716S and the flexible posts 716F are brought within registration proximity to the magnet structures 718, ferromagnetic autogenous registration of the solid posts 716S and flexible posts 716F above and within horizontal areas of the magnet structures 718 occurs. The spring sections 717 of the flexible posts 716F allow the base portions 719 of the flexible posts 716F to be drawn against the first side 724 of the printed wiring board 710 by extension of the spring sections 717. Upon seating of the heat spreader 714 against the several microelectronic device components 712A, 712B, and 712C, the spring sections 717 of the flexible posts 716F remain in tension.

FIG. 8 is a simplified process flow diagram 800 of a method of assembling a heat spreader to a printed wiring board, according to embodiments of the disclosure.

At 810, the method includes placing a heat spreader on a printed wiring board by way of magnetic attraction of heat spreader posts to magnet structures associated with (e.g., attached to, at least partially embedded within) the printed wiring board. In a non-limiting example embodiment, the microelectronic device component 112 in FIG. 1A is assembled between the heat spreader 114 and the printed wiring board 110 where the magnet structures 118, brought into registration proximity with the posts 116, autogenously align with the posts 116.

At 812, the method may include having the magnet structures at least partially embedded in the printed wiring board. In a non-limiting example embodiment, the magnet structures 118 in FIG. 1A are at least partially embedded in the printed wiring board 110.

At 814, the method may include having the magnet structures on a first side of the printed wiring board. In a non-limiting example embodiment, the magnet structures 218 in FIG. 2 are on the first side 224 of the printed wiring board 210.

At 816, the method may include having the magnet structures on a second side of the printed wiring board. In a non-limiting example embodiment, the magnet structures 418 in FIG. 4 are on the second side 426 of the printed wiring board 410.

At 820, the method may include assembling the printed wiring board assembly to an electronic system. Such electronic system embodiments are disclosed herein.

Heat spreader structures that are magnetically aligned to printed wiring boards, with magnet structures associated with the printed wiring boards, such as the printed wiring board assemblies 100 (FIG. 1A), 200 (FIG. 2), 300 (FIG. 3), 400 (FIG. 4), 500 (FIG. 5), 600 (FIG. 6) and 700 (FIG. 7) may be included in embodiments of electronic systems of the disclosure. FIG. 9 is a block diagram of an electronic system 900, according to embodiments of disclosure. Such an electronic system 900 may include, for example, one or more of the printed wiring board assemblies 100 (FIGS. 1A and 1B), 200 (FIG. 2), 300 (FIG. 3), 400 (FIG. 4), 500 (FIG. 5), 600 (FIG. 6), and 700 (FIG. 7) of the disclosure, which may be included as described and illustrated, in whole or in part, as an electronic system 900. The electronic system 900 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, and/or a navigation device, where embodiments of printed wiring board assemblies 100 (FIGS. 1A and 1B), 200 (FIG. 2), 300 (FIG. 3), 400 (FIG. 4), 500 (FIG. 5), 600 (FIG. 6), and 700 (FIG. 7) of the disclosure may be employed. The electronic system 900 includes at least one memory device 920. The memory device 920 may include, for example, one or more microelectronic devices that are wire bonded to embodiments of the printed wiring board assemblies 100 (FIGS. 1A and 1B), 200 (FIG. 2), 300 (FIG. 3), 400 (FIG. 4), 500 (FIG. 5), 600 (FIG. 6), and 700 (FIG. 7) of the disclosure. The electronic system 900 may further include at least one electronic signal processor device 910 (often referred to as a "microprocessor") that is part of an integrated circuit. The electronic signal processor device 910 may include, for example, one or more of more microelectronic devices that are either wire bonded or flip-chip bonded to embodiments of the printed wiring board assemblies 100 (FIG. 1A), 200 (FIG. 2), 300 (FIG. 3), 400 (FIG. 4), 500 (FIG. 5), 600 (FIG. 6), and 700 (FIG. 7) of the disclosure. While the memory device 920 and the electronic signal processor device 910 are depicted as two (2) separate devices in FIG. 9, in additional embodiments, a single (e.g., only one) memory/ processor device having the functionalities of the memory device 920 and the electronic signal processor device 910 is included in the electronic system 900. In such embodiments, the memory/processor device may include, for example, one or more of more microelectronic devices that are either wire bonded or flip-chip bonded to embodiments of the printed wiring board assemblies 100 (FIG. 1A), 200 (FIG. 2), 300 (FIG. 3), 400 (FIG. 4), 500 (FIG. 5), 600 (FIG. 6), and 700 (FIG. 7) of the disclosure. The processor device 910 and the memory device 920 may be part of a central processing unit where the memory device 920 includes a wire bonded memory device that includes on-die DRAM cache memory. The processor device 910 and the memory device 920 may be part of a disaggregated-die assembly 950 that may also be referred to as a disaggregated-die integrated circuit, including at least one of the processor device 910 and the memory device 920 includes more than one of such device in a more-than-two device disaggregated-die integrated circuit assembly where one or more of more microelectronic devices are either wire bonded or flip-chip bonded to embodiments of printed wiring board assemblies 100 (FIG. 1A), 200 (FIG. 2), 300 (FIG. 3), 400 (FIG. 4), 500 (FIG. 5), 600 (FIG. 6), and 700 (FIG. 7) of the disclosure. Further, the disaggregated-die assembly 950, may be assembled with a bridge material such as in an embedded multi-interconnect bridge (EMIB) that may include at least one TSV interconnect in one of the dice being coupled to the EMIB.

The electronic system 900 may further include one or more input devices 930 for inputting information into the electronic system 900 by a user, such as, for example, a mouse or other pointing device, a keyboard, a touchpad, a button, or a control panel. The electronic system 900 may further include one or more output devices 940 for outputting information (e.g., visual or audio output) to a user such as, for example, a monitor, a display, a printer, an audio output jack, and/or a speaker. In some embodiments, the input device 930 and the output device 940 may comprise a single touchscreen device that can be used both to input information to the electronic system 900 and to output visual information to a user. The input device 930 and the output device 940 may communicate electrically with one or more of the memory device 920 and the electronic signal processor device 910.

Thus, disclosed is a printed wiring board assembly, comprising a printed wiring board including a first side and a second side opposite first side; magnet structures in physical contact with the printed wiring board; a microelectronic device component coupled to the first side of the printed wiring board; a heat spreader overlying and in thermal communication with the microelectronic device component; and posts coupled to the heat spreader and horizontally neighboring the microelectronic device component, the posts in magnetic communication with the magnet structures.

Thus, also disclosed is a method of forming a printed wiring board assembly, comprising bringing a heat spreader having posts coupled thereto into registration proximity with a printed wiring board having magnet structures in physical contact therewith; and autogenously magnetically aligning and coupling the posts with the magnet structure.

Thus, an electronic system, comprising an input device; an output device; a processor device operably coupled to the input device and the output device; a memory device operably coupled to the processor device; and a printed wiring board assembly comprising: a printed wiring board underlying and coupled the processor device; magnet structures in physical contact with the printed wiring board; a heat spreader overlying and thermally coupled to the processor device; and posts extending from the heat spreader toward the printed wiring board, the heat spreader coupled to the printed wiring board by way of ferromagnetic attraction between the magnet structures and the posts.

Components that support active microelectronic devices such as processors and memory, may be assembled to a printed wiring board where the components have a vertical profile height that is low, where the components are embedded in the printed wiring board, and are located in areas not previously useful, such as below a microelectronic device that is flip-chip mounted on the printed wiring board.

While the disclosure is susceptible to various modifications and alternative forms, specific embodiments have been shown by way of example in the drawings and have been described in detail herein. However, the disclosure is not limited to the particular forms disclosed. Rather, the disclosure encompasses all modifications, equivalents, and alternatives falling within the scope of the following appended claims and their legal equivalents.

What is claimed is:

1. A printed wiring board assembly, comprising:
a printed wiring board including a first side and a second side opposite the first side;
magnet structures in direct physical contact with the printed wiring board;
a microelectronic device component coupled to the first side of the printed wiring board;
a heat spreader overlying and in thermal communication with the microelectronic device component; and
posts comprising ferromagnetic material coupled to the heat spreader and horizontally neighboring the microelectronic device component, the posts embedded within the heat spreader, extending toward the printed wiring board, and in magnetic communication with the magnet structures.

2. The printed wiring board assembly of claim 1, wherein:
the magnet structures are on the first side of the printed wiring board; and
the posts are slidingly coupled to the magnet structures under ferromagnetic attraction.

3. The printed wiring board assembly of claim 1, wherein the magnet structures comprise:
upper magnet structures attached to the posts; and
lower magnet structures vertically underlying and in horizontal alignment with the upper magnet structures, the lower magnet structures in physical contact with the printed wiring board and vertically spaced apart from the upper magnet structures by material of the printed wiring board.

4. The printed wiring board assembly of claim 1, wherein:
the magnet structures are at least partially embedded in the printed wiring board;
the posts are located on the first side of the printed wiring board; and
solder resist material intervenes between the posts and the magnet structures.

5. The printed wiring board assembly of claim 1, wherein the magnet structures are in physical contact with the second side of the printed wiring board.

6. The printed wiring board assembly of claim 1, wherein the microelectronic device component is flip-chip mounted on the first side of the printed wiring board with electrical bumps.

7. The printed wiring board assembly of claim 1, wherein the microelectronic device component is mounted on the first side of the printed wiring board with bond wires contacting bond pads at the first side of the printed wiring board.

8. The printed wiring board assembly of claim 1, wherein the posts individually comprise a flexible section under tension between the heat spreader and the first side of the printed wiring board.

9. The printed wiring board assembly of claim 1, wherein at least one of the magnet structures has greater magnetic attractive force than at least one other of the magnet structures.

10. The printed wiring board assembly of claim 1, further comprising an additional microelectronic device component coupled to the first side of the printed wiring board and in thermal communication with the heat spreader.

11. The printed wiring board assembly of claim 10, wherein the microelectronic device component and the additional microelectronic device component are each flip-chip mounted on the first side of the printed wiring board with electrical bumps.

12. The printed wiring board assembly of claim 10, wherein:
one of the microelectronic device component and the additional microelectronic device component is flip-chip mounted on the first side of the printed wiring board with electrical bumps; and
one other of the microelectronic device component and the additional microelectronic device component is mounted on the first side of the printed wiring board with bond wires contacting bond pads at the first side of the printed wiring board.

13. The printed wiring board assembly of claim 1, wherein one of the posts is affixed to the printed wiring board by way of a mechanical fastener extending through the printed wiring board.

14. A method of forming a printed wiring board assembly, comprising:
bringing a heat spreader having posts embedded therein into registration proximity with a printed wiring board having magnet structures in direct physical contact therewith, the posts comprising ferromagnetic material and extending toward the printed wiring board; and
autogenously magnetically aligning and coupling the posts with the magnet structures.

15. The method of claim 14, further comprising:
coupling a microelectronic device component to a first side of the printed wiring board; and
thermally coupling the heat spreader to the microelectronic device component, the posts horizontally neighboring the microelectronic device component.

16. The method of claim 14, further comprising selecting at least one of the magnet structures to have a greater magnetic attractive force than at least one other of the magnet structures.

17. The method of claim 14, further comprising selecting at least one of the posts to include a flexible section that extends under magnetic attractive force imparted on the at least one of the posts by at least one of the magnet structures.

18. An electronic system, comprising:
an input device;
an output device;
a processor device operably coupled to the input device and the output device;
a memory device operably coupled to the processor device; and
a printed wiring board assembly comprising:
a printed wiring board underlying and coupled the processor device;
magnet structures in direct physical contact with the printed wiring board;
a heat spreader overlying and thermally coupled to the processor device; and
posts comprising ferromagnetic material embedded within the heat spreader and extending from the heat spreader toward the printed wiring board, the heat spreader coupled to the printed wiring board by way of ferromagnetic attraction between the magnet structures and the posts.

19. The electronic system of claim 18, wherein:

the memory device coupled to the printed wiring board; and the heat spreader overlies and is thermally coupled to the memory device.

20. The electronic system of claim 18, further comprising an additional microelectronic device flip-chip coupled to the printed wiring board and horizontally neighboring the processor device, the heat spreader thermally coupled to the additional microelectronic device.

21. The printed wiring board assembly of claim 1, further comprising low-friction material between the magnetic structures and the posts.

\* \* \* \* \*